(12) United States Patent
Chen et al.

(10) Patent No.: US 8,674,767 B2
(45) Date of Patent: Mar. 18, 2014

(54) BODY BIASING DEVICE AND OPERATIONAL AMPLIFIER THEREOF

(75) Inventors: Wen-Yen Chen, Taichung (TW); Ming-Hung Chang, Hsinchu County (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 55 days.

(21) Appl. No.: 13/414,674

(22) Filed: Mar. 7, 2012

(65) Prior Publication Data
US 2013/0169363 A1 Jul. 4, 2013

(30) Foreign Application Priority Data
Jan. 2, 2012 (TW) .............................. 101100027 A

(51) Int. Cl.
*H03F 3/45* (2006.01)
(52) U.S. Cl.
USPC .......................................................... 330/261

(58) Field of Classification Search
USPC .................................................. 330/252–261
See application file for complete search history.

(56) References Cited

U.S. PATENT DOCUMENTS 6,614,301 B2 * 9/2003 Casper et al. .................. 330/253
7,944,299 B2 * 5/2011 Mangudi et al. .............. 330/253

* cited by examiner

*Primary Examiner* — Hieu Nguyen
(74) *Attorney, Agent, or Firm* — Winston Hsu; Scott Margo

(57) ABSTRACT

A body biasing device for an amplifier which has a P-type differential pair and outputs an output signal at an output node according to a differential input signal pair is disclosed. The body biasing device includes a detection unit coupled to the operational amplifier for detecting a detected voltage related to the differential input signals and accordingly outputting a control signal; and a selection unit coupled to the detection unit and the operational amplifier for outputting a body bias to the P-type differential pair according to the control signal.

22 Claims, 7 Drawing Sheets

BODY BIASING DEVICE AND OPERATIONAL AMPLIFIER THEREOF

BACKGROUND OF THE INVENTION

1. Field of the Invention

The present invention relates to a body biasing device and an operational amplifier thereof, and more particularly, to a body biasing device capable of changing a body bias of a P-type differential pair of an input stage in an operational amplifier according to a node voltage related to differential input signals of the operational amplifier and an operational amplifier thereof.

2. Description of the Prior Art

Operational amplifiers are basic circuit elements in analog integrated circuitry. Generally speaking, an input stage of an operational amplifier in the prior art commonly uses P-type differential pair to acquire smaller noise, larger slew rate and higher unity-gain frequency.

For example, please refer to FIG. 1, which introduces a schematic diagram of an operational amplifier 10, wherein a supply voltage range of the operational amplifier 10 is within a voltage VCC to a voltage –VCC. In brief, an input stage 100, an output stage 102 and a current source CS of the operational amplifier 10 are shown in FIG. 1, circuitry unrelated to the concept of the present invention, such as a gain stage and a bias circuit, are not shown in FIG. 1. The input stage 100 comprises a P-type differential pair consisting of a PMOS P_IN and a PMOS P_IP, and is utilized for outputting a differential output signal $V_{OUTN}$ and a differential output signal $V_{OUTP}$ according to a differential input signal $V_{IN}$ and a differential input signal $V_{IP}$.

The output stage 102 is utilized for receiving the differential output signal $V_{OUTN}$ and the differential output signal $V_{OUTP}$ and accordingly outputting an output signal $V_{OUT}$ at an output node OUT. The current source CS provides an operating current of the input stage 100. Besides, since a substrate of integrated circuitry normally is a P-substrate consisting of P-type semiconductor and a body of a PMOS is N-well built in the substrate and consisting of N-type semiconductor, a P-N junction is formed between the P-substrate and the N-well. In other words, the P-substrate and the N-well equal a diode. Therefore, a parasitic diode Dpar is shown in FIG. 1. The parasitic diode Dpar is between a ground GND and a body of the PMOS P_IN and a body of the PMOS P_IP, and is utilized for representing the non-ideal effects between the P-substrate and the N-well.

When swing of the differential pair signals $V_{IN}$, $V_{IP}$ are too large, a forward bias $V_{diode}$ might be larger than a P-N junction forward conduction voltage $V_{on}$, i.e. a source voltage $V_S$ of the PMOS P_IN, P_IP might be smaller than the negative P-N junction forward conduction voltage $-V_{on}$ ($V_S < -V_{on}$). As a result, the parasitic diode Dpar is conducted. In such a condition, an additional current will feed into the input stage 100 and result in the input stage 100 working abnormally.

In general, if the input stage of the operational amplifier is an N-type differential pair, i.e. the differential pair consisted of NMOS, the above mentioned additional current is not generated and the input stage can work normally. However, if the input stage of the operational amplifier 10 only uses the N-type differential pair, the operational amplifier 10 cannot achieve rail-to-rail structure and the input common mode range of the operational amplifier is smaller. In addition, if the input stage of the operational amplifier 10 is the N-type differential pair, the performance of the noise, slew rate and the unity-gain frequency of the operational amplifier degrade.

Another method for preventing the additional current feeding into the input stage 100 is using high voltage devices to achieve the operational amplifier 10 and coupling the body of the PMOS P_IN, P_IP to the highest voltage of the operational amplifier 10 (i.e. voltage VCC). However, using the high voltage devices increases cost of the integrated circuitry. In addition, the performance of the high voltage devices is poorer and the noise of the high voltage devices is larger, such that the performance of the operational amplifier 10 degrades. Thus, there is a need to improve the prior art.

SUMMARY OF THE INVENTION

Therefore, the present invention mainly provides a body biasing device and an operational amplifier thereof capable of changing a body bias of a P-type differential pair of an input stage in an operational amplifier according to a node voltage related to differential input signals in the operational amplifier.

The present invention discloses a body biasing device for an operational amplifier which has a P-type differential pair and outputs an output signal at an output node according to differential input signals. The body biasing device comprises a detection unit coupled to the operational amplifier for detecting a detected voltage related to the differential input signal pair and accordingly outputting a control signal; and a selection unit coupled to the detection unit and the operational amplifier for outputting a body bias to the P-type differential pair according to the control signal.

The present invention further discloses an operational amplifier. The operational amplifier comprises an output stage circuit for receiving a differential output signal pair and accordingly outputting an output signal at an output node; a P-type differential pair for receiving a differential input signal pair and accordingly outputting the differential output signal pair, comprising a first P-type transistor comprising a gate coupled to a first differential input, a source coupled to a current source, a drain coupled to the output stage circuit, and a body coupled to a body bias, and a second P-type transistor comprising a gate coupled to a second differential input, a source coupled to the current source, a drain coupled to the output stage circuit, and a body coupled to the body bias; and a body biasing device comprising a detection unit for detecting a detected voltage related to the differential input signal pair to output a control signal, and a selection unit coupled to the detection unit for outputting the body bias according to the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
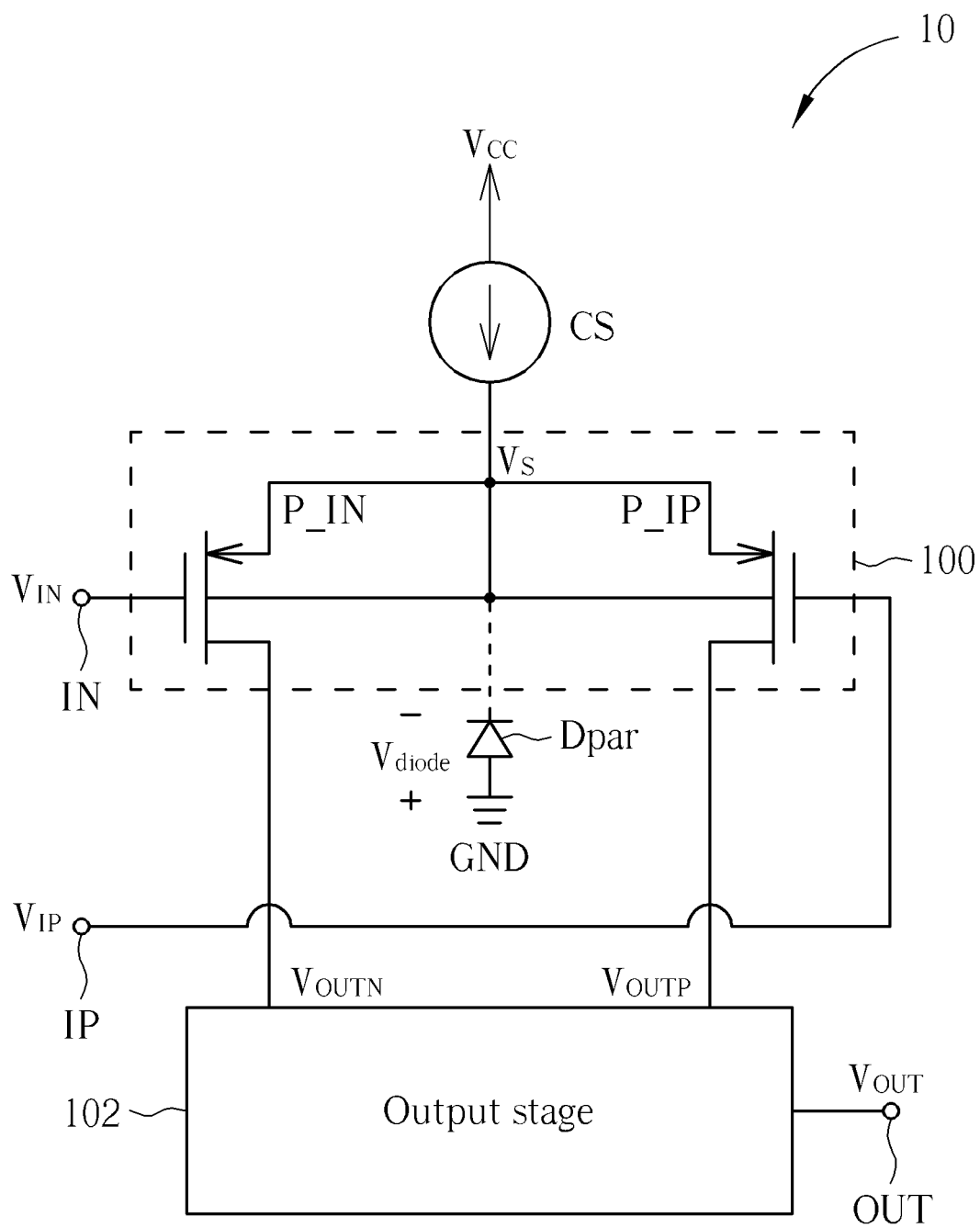
FIG. 1 introduces a schematic diagram of an operational amplifier in the prior art.
Figure 2:
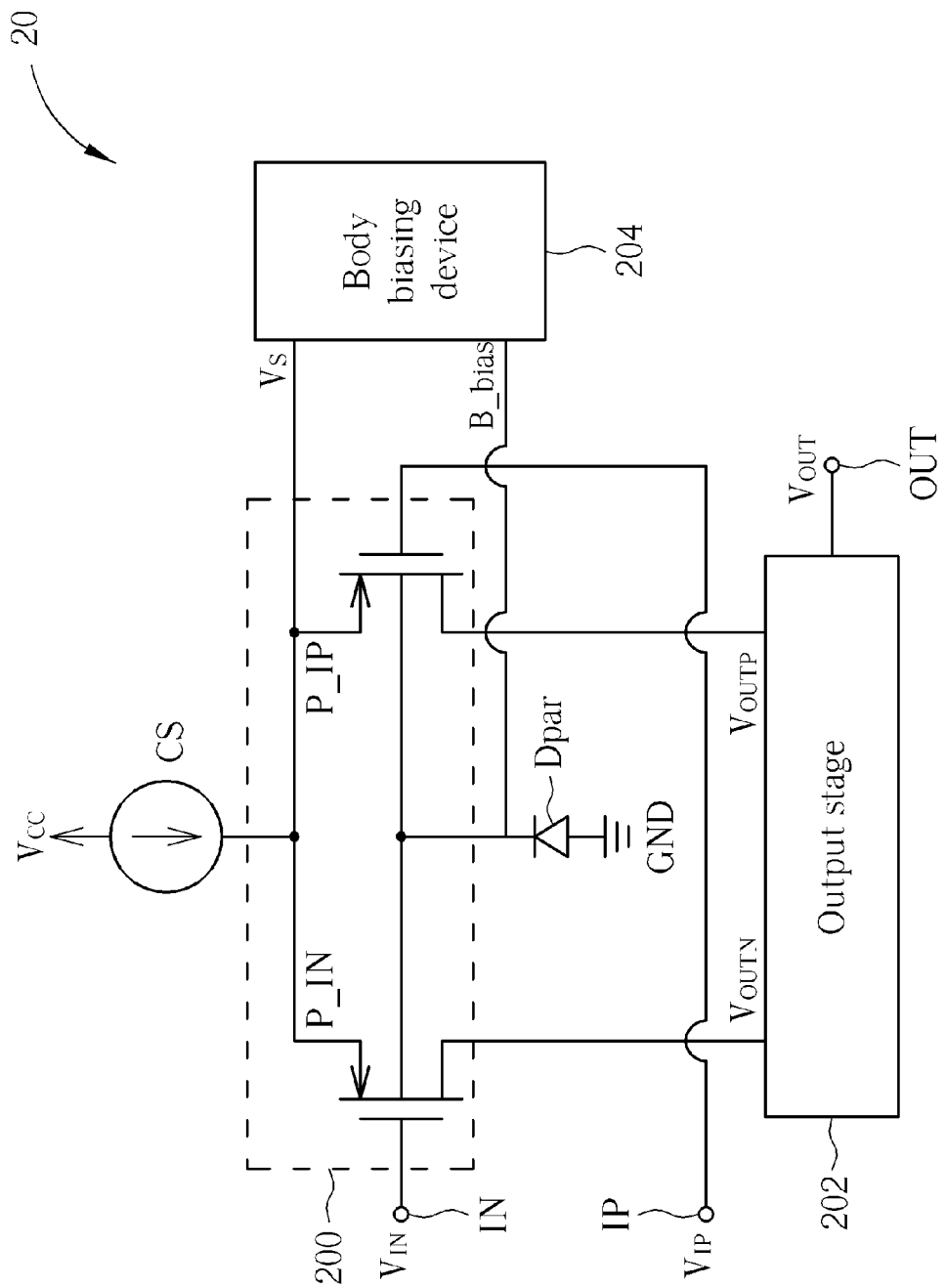
FIG. 2 introduces a schematic diagram of an operational amplifier according to an embodiment of the present invention.

Please refer to FIG. 2, which introduces a schematic diagram of an operational amplifier 20 according to an embodiment of the present invention. The operational amplifier 20 receives differential input signal pair $V_{IN}$, $V_{IP}$ and accordingly outputs an output voltage $V_{OUT}$. As shown in FIG. 2, the operational amplifier 20 comprises an input stage 200, an output stage 202, a body biasing device 204 and a current source CS. Since the operational method and structure of the input stage 200, the output stage 202 and the current source CS are similarly to the operational method and structure of the input stage 100, the output stage 102 and the current source CS shown in FIG. 1, the input stage 200, the output stage 202 and the current source CS use the same component symbols. A parasitic diode Dpar between a ground GND and a body of a PMOS P_IN is shown in FIG. 2, to represent the non-ideal effect between the P-substrate and the N-well. The difference between the operational amplifier 20 and the operational amplifier 10 is that the operational amplifier 20 further comprises body biasing device 204 for outputting a body bias B_bias according to a detected voltage $V_D$ related to differential input signals $V_{IN}$, $V_{IP}$, and preventing the additional current from the substrate feeding into the input stage 200 through the parasitic diode Dpar.

In detail, as shown in FIG. 2, the body biasing device 204 is coupled to a source of the PMOS P_IN and detects the source voltage $V_S$ as the detected voltage $V_D$. Therefore, when the source voltage $V_S$ is larger than the negative P-N junction forward conduction voltage $-V_{on}$ ($V_S$>$-V_{on}$), the body biasing device 204 outputs the source voltage $V_S$ as the body bias B_bias. In such a condition, the parasitic diode is not conducted, and there is no additional current from substrate feeding into the input stage 200 through parasitic diode Dpar. When the source voltage $V_S$ is smaller than the negative P-N junction forward conduction voltage $-V_{on}$ ($V_S$<$-V_{on}$), the body biasing device 204 switches the body bias B_bias to a voltage which is larger than the negative P-N junction forward conduction voltage $-V_{on}$ for preventing the parasitic diode Dpar from conducting. In other words, the body biasing device 204 adequately adjusts the body bias B_bias according to the variation of the source voltage $V_S$. Therefore, the parasitic diode Dpar does not conduct, such that the condition of the additional current feeding into the input stage 200 resulting in the operational amplifier 20 working abnormally can be prevented.

Figure 3:
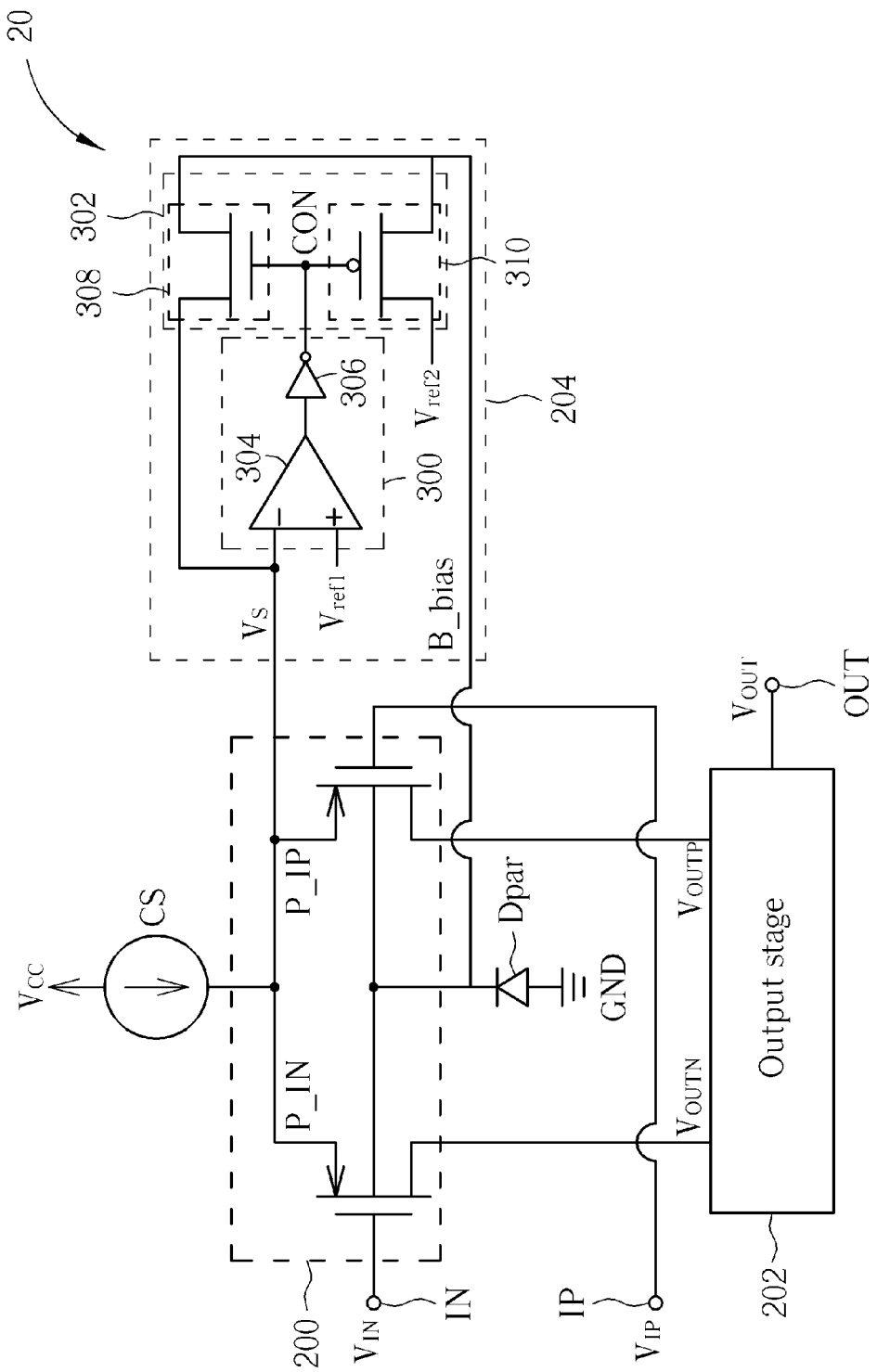
FIG. 3 introduces a schematic diagram of an implementation method of the operational amplifier shown in FIG. 2.

More particularly, please refer to FIG. 3, which introduces a schematic diagram of an implementation method of the body biasing device 204 shown in FIG. 2. As shown in FIG. 3, the body biasing device 204 comprises a detection unit 300 and a selection unit 302. The detection unit 300 is coupled to the source of the PMOS P_IN for detecting the source voltage $V_S$ as the detected voltage $V_D$. According to the source voltage $V_S$, the detection unit 300 generates and outputs a control signal CON for indicating the conducting status of the parasitic diode Dpar to the selection unit 302. The selection unit 302 is coupled to the detection unit 300 for outputting the body bias B_bias according to the control signal CON.

In detail, the detection unit 300 comprises a comparator 304 and an inverter 306. The comparator 304 receives a reference voltage $V_{ref1}$ at a positive input, receives the source voltage $V_S$ at a negative input and outputs a comparison result.

The reference voltage $V_{ref1}$ is the negative P-N junction forward conduction voltage ($V_{ref1}$=$-V_{on}$). The inverter 306 receives the comparison result and generates the control signal CON to the selection unit 302. The selection unit 302 comprises a transistor 308 and a transistor 310. The transistor 308 is a NMOS for outputting the source voltage $V_S$ as the body bias B_bias when the control signal indicates a cut-off status. The transistor 310 is a PMOS for outputting a reference voltage $V_{ref2}$ as the body bias B_bias when the control signal indicates a conducting status, wherein the reference voltage $V_{ref2}$ is a voltage larger than the negative P-N junction forward conduction voltage $-V_{on}$ ($V_{ref2}$>$-V_{on}$).

More particularly, when the source voltage $V_S$ is larger than the reference voltage $V_{ref1}$, the comparator 304 outputs the comparison result in low logic voltage, thus the control signal CON is in high logic voltage. In such a condition, the transistor 308 is conducted and the transistor 310 is cut-off, such that the body bias B_bias equals the source voltage $V_S$. On the other hand, when the source voltage $V_S$ is smaller than the reference voltage $V_{ref1}$, the comparator 304 outputs the comparison result in high logic voltage, thus the control signal CON is switched to low logic voltage. In such a condition, the transistor 308 is cut-off and the transistor 310 is conducted, such that the body bias B_bias equals the reference voltage $V_{ref2}$, wherein the reference voltage $V_{ref2}$ is a voltage larger than the negative P-N junction forward conduction voltage $-V_{on}$ ($V_{ref2}$>$-V_{on}$).

In brief, the present invention can utilize the detection unit 300 for detecting the source voltage $V_S$ to monitor the variation of the differential input signals $V_{IN}$, $V_{IP}$ and to control the selection unit 302 to output the appropriate body bias B_bias to prevent the parasitic diode Dpar from conducting. Therefore, the operational amplifier 20 can work normally even if the swings of the differential input signals $V_{IN}$, $V_{IP}$ are too large.

Figure 4:
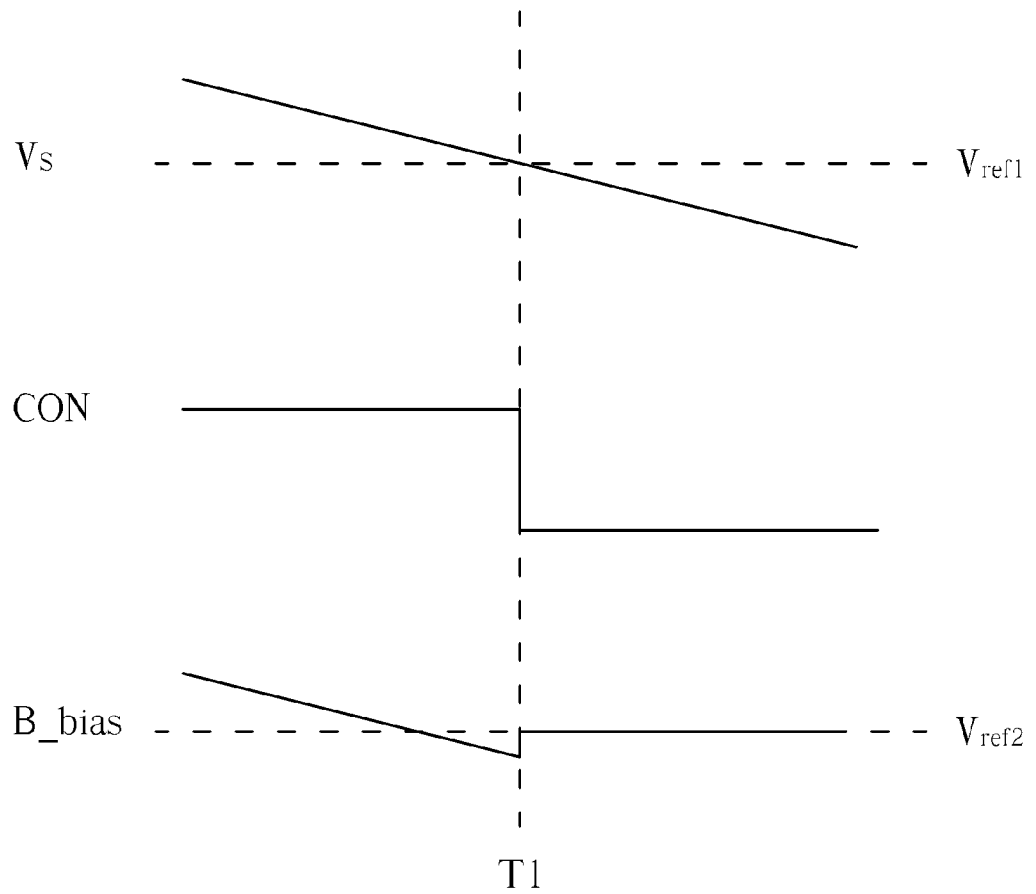
FIG. 4 introduces a waveform of related signals when the body biasing device shown in FIG. 3 operates.

Furthermore, please refer to FIG. 4, which introduces a waveform of the related signals while the body biasing device 204 shown in FIG. 3 is operating. As shown in FIG. 4, the source voltage $V_S$ is larger than the reference voltage $V_{ref1}$ before a time T1, thus the control signal CON is high logic voltage. In such a condition, the body bias B_bias equals the source voltage $V_S$. After the time T1, the source voltage $V_S$ is smaller than the reference voltage $V_{ref1}$, thus the control signal CON is switched to low logic voltage. In such a condition, the body bias B_bias is switched to the reference voltage $V_{ref2}$.

Figure 5A:
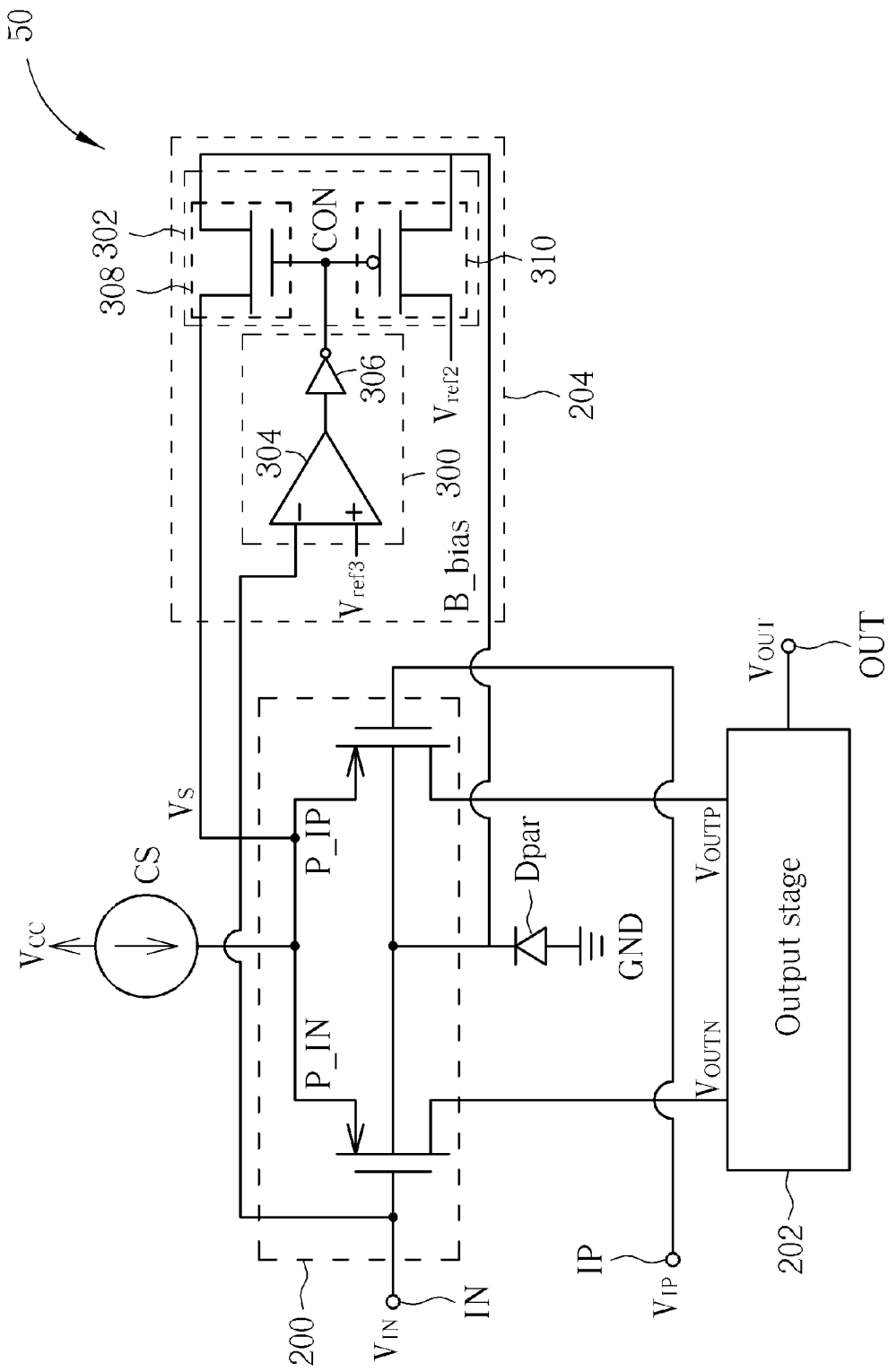
FIG. 5A introduces another implementation method of the body biasing device shown in FIG. 3.

As can be seen from above, the present invention utilizes the detection unit 300 for detecting the detected voltage $V_D$ to monitor the variation of the differential input signals $V_{IN}$, $V_{IP}$ and for accordingly outputting the body bias B_bias to the body of the PMOS P_IN, P_IP to prevent the parasitic diode from conducting. In addition, the detection unit 300 also can adjust the body bias B_bias through detecting the voltage of the differential input signals $V_{IN}$, $V_{IP}$. For example, please refer to FIG. 5A and FIG. 5B, which separately introduce schematic diagrams of the operational amplifier 50 and an operational amplifier 52 according to embodiments of the present invention.

The operational amplifier 50 and the operational amplifier 52 are similar to the operational amplifier 20 shown in FIG. 3. The differences is that the detection unit 300 in the operational amplifier 50 shown in FIG. 5 is coupled to a gate of the PMOS P_IN for detecting the differential input signal $V_{IN}$ as the detecting voltage $V_D$. Besides, the comparator 304 receives a reference voltage $V_{ref3}$, wherein the reference voltage $V_{ref3}$ equals the reference voltage $V_{ref1}$ plus a threshold voltage $V_{tp}$ of a PMOS (i.e. $V_{ref3}$=$V_{ref1}$+$V_{tp}$). Noticeably, the transistor 308 is still coupled to the source of the PMOS P_IN. Therefore, when the differential input signal $V_{IN}$ is larger than the reference voltage $V_{ref3}$, the body bias B_bias equals the source voltage $V_S$. When the differential input signal $V_{IN}$ is smaller than the reference voltage $V_{ref3}$, the body bias B_bias is switched to the reference voltage $V_{ref2}$ to prevent the additional current from the substrate feeding into the input stage 200 through the parasitic diode Dpar.

Figure 5B:
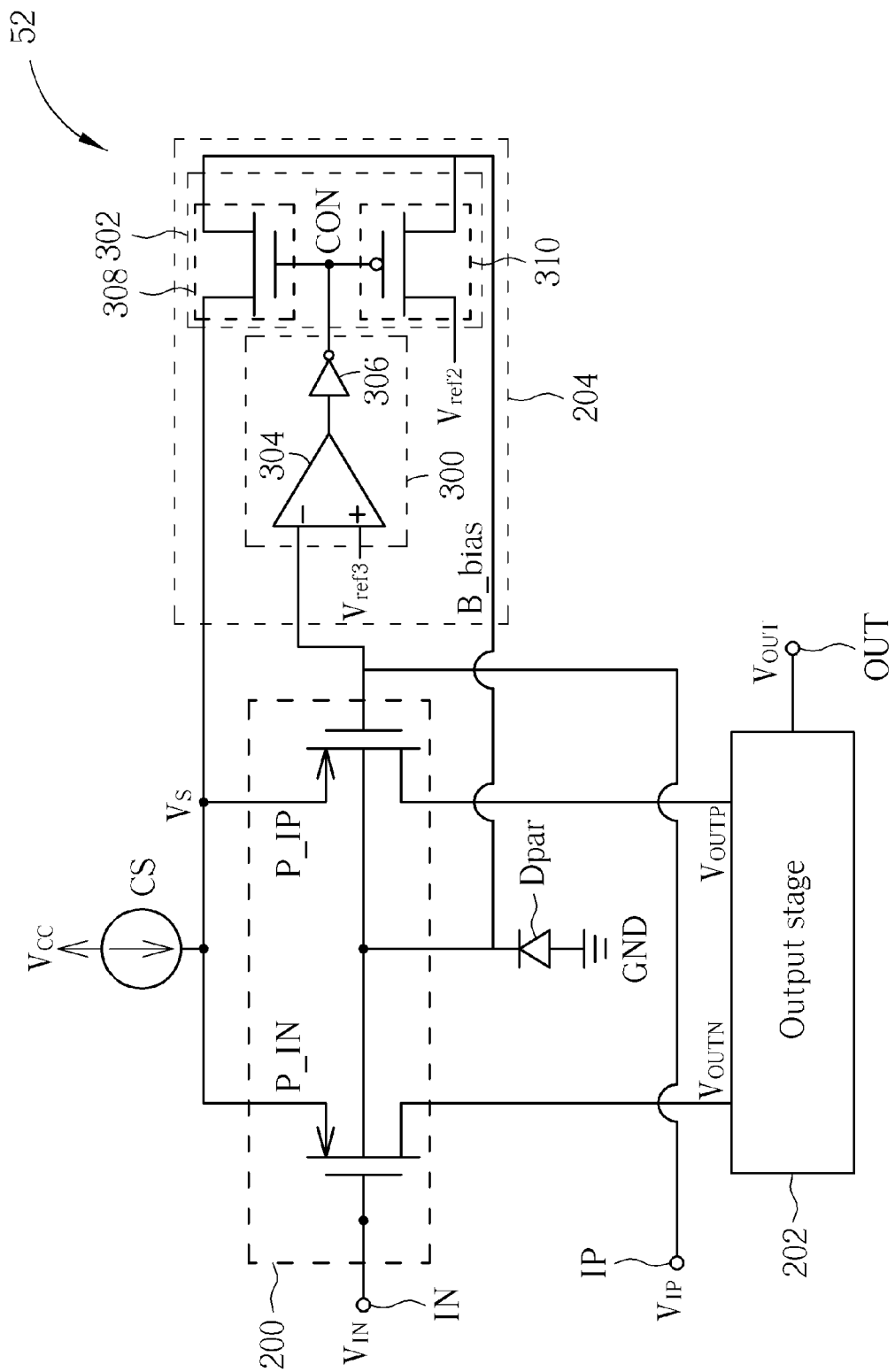
FIG. 5B introduces another implementation method of the body biasing device shown in FIG. 3.

On the other hand, the detection unit 300 of the operational amplifier 52 shown in FIG. 5B is coupled to a gate of the PMOS P_IP for detecting the differential input signal $V_{IP}$ as the detected voltage $V_D$ and outputting appropriate body bias B_bias to the body of the PMOS P_IN and the PMOS P_IP, so as to prevent the parasitic diode Dpar from conducting. For detailed operation of the operational amplifier 52 please refer to the above.

Figure 6:
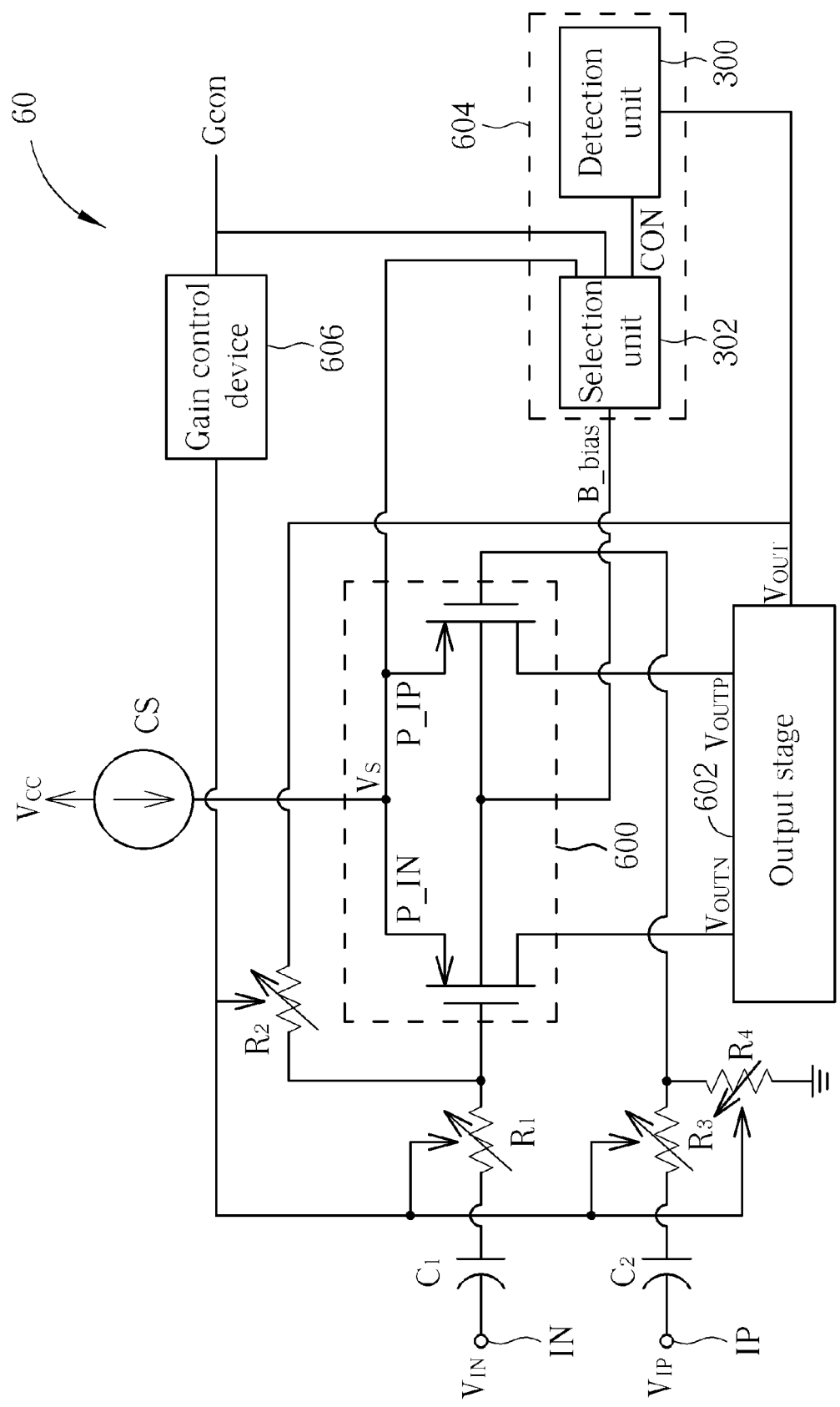
FIG. 6 introduces another implementation method of the operational amplifier shown in FIG. 2.

In addition, since the output signal $V_{OUT}$ is also related to the differential input signal $V_{IN}$, $V_{IP}$, the detected voltage $V_D$ also can be output signal $V_{OUT}$. As a result, the body biasing device 204 can utilize the output signal $V_{OUT}$ as the reference of the variation of differential input signals $V_{IN}$, $V_{IP}$. For example, please refer to FIG. 6, which introduces a schematic diagram of an operational amplifier 60 according to an embodiment of the present invention. The operational amplifier 60 comprises an input stage 600, an output stage 602, a body biasing device 604, a gain control device 606, a current source CS, coupling capacitors C1, C2 and the tunable resistors R1~R4. The detection unit 300 of the body biasing device 604 is coupled to the output stage 602 and detects the output signal $V_{OUT}$ as the detected voltage $V_D$. The detection unit 300 generates and outputs the control signal CON which indicates the conducting status of the parasitic diode Dpar to the selection unit 302. On the other hand, the operational amplifier 60 utilizes gain control device 606 for changing a gain ratio of the output signal $V_{OUT}$ to the differential input signals $V_{IN}$, $V_{IP}$. In detail, the gain control device 606 receives a gain control signal Gcon to adjust the resistance of the tunable resistors R1~R4, so as to change the gain ratio of the output signal $V_{OUT}$ to the differential input signals $V_{IN}$, $V_{IP}$. In such a condition, the selection unit can appropriately output the body bias B_bias according to the gain control signal Gcon and the control signal CON for preventing the parasitic diode Dpar from conducting.

Noticeably, the present invention generates appropriate body bias to the P-type differential pair of the input stage in the operational amplifier through detecting the voltage related to the differential input signals of the operational amplifier, so as to prevent the additional current from the substrate feeding into the input stage resulting in the operational amplifier working abnormally. According to different applications, those skilled in the art can accordingly observe appropriate modifications and alternations. For example, as long as ensuring the parasitic diode Dpar does not conduct, the reference voltage $V_{ref1}$ can be a voltage larger than the negative P-N junction forward conduction voltage ($V_{ref1}$ >– $V_{on}$).

To sum up, in the prior art, the additional current from the substrate feeds into the P-type different pair of the input stage in the operational amplifier when the swing of the differential input signal is too large. Different from the prior art, the body biasing device disclosed by the present invention is capable of accordingly adjusting the body bias of the input stage, so as to prevent the parasitic diode between P-substrate and the N-well from conducting. In other words, using the body biasing device disclosed by the present invention, the operational amplifier can prevent the additional current from the substrate feeding into the input stage of the operational amplifier without using the high voltage devices. As a result, the performance of the operational amplifier can be improved and the cost of the integrated circuitry can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A body biasing device for an operational amplifier which has a P-type differential pair and outputs an output signal at an output node according to a differential input signal pair, comprising:
 a detection unit coupled to the operational amplifier for detecting a detected voltage related to the differential input signal pair and accordingly outputting a control signal; and
 a selection unit coupled to the detection unit and the operational amplifier for outputting a body bias to the P-type differential pair according to the control signal;
 wherein the P-type differential pair comprising:
  a first P-type transistor comprising a gate coupled to a first differential input, a source coupled to a current source, a drain coupled to an output stage circuit, and a body coupled to the selection unit; and
  a second P-type transistor comprising a gate coupled to a second differential input, a source coupled to the current source, a drain coupled to the output stage circuit, and a body coupled to the selection unit;
 wherein the detection unit is coupled to the gate of the first P-type transistor for detecting the detected voltage.

2. The body biasing device of claim 1, wherein the detection unit is coupled to the output node of the amplifier for detecting the detected voltage related to the differential input signal pair to output the control signal.

3. The body biasing device of claim 1, wherein a supply voltage of the amplifier is within a positive voltage and a negative voltage.

4. The body biasing device of claim 1, wherein the detection unit comprises:
 a comparator for comparing the detected voltage and a first reference voltage to output a comparison result; and
 an inverter for receiving the comparison result to output the control signal.

5. The body biasing device of claim 4, wherein the first reference voltage is larger than a sum of a negative P-N junction forward conduction voltage and a threshold voltage of the first P-type transistor.

6. The body biasing device of the claim 4, wherein the detection unit outputs the control signal indicating a conducting status when the detected voltage is smaller than the first reference voltage.

7. The body biasing device of the claim 4, wherein the detection unit outputs the control signal indicating a cut-off status when the detected voltage is larger than the first reference voltage.

8. The body biasing device of claim 1, wherein the selection unit comprises:
 a first transistor comprising a gate coupled to receive the control signal, a source coupled to the source of the first P-type transistor, and a drain coupled to output the body bias; and
 a second transistor comprising a gate coupled to receive the control signal, a source coupled to receive a second reference voltage, and a drain coupled to output the body bias.

9. The body biasing device of claim 8, wherein the second reference voltage is larger than a negative P-N junction forward conduction voltage.

10. The body biasing device of claim 8, wherein the first transistor is conducted when the control signal indicates a cut-off status such that the body bias equals the voltage of the source of the first P-type transistor.

11. The body biasing device of claim 8, wherein the second transistor is conducted when the control signal indicates a conducting status such that the body bias equals the second reference voltage.

12. An operational amplifier, comprising:
 an output stage circuit for receiving a differential output signal pair and accordingly outputting an output signal at an output node;
 a P-type differential pair for receiving a differential input signal pair and accordingly outputting the differential output signal pair, comprising:
  a first P-type transistor comprising a gate coupled to a first differential input, a source coupled to a current source, a drain coupled to the output stage circuit, and a body coupled to a body bias; and
  a second P-type transistor comprising a gate coupled to a second differential input, a source coupled to the current source, a drain coupled to the output stage circuit, and a body coupled to the body bias; and
 a body biasing device comprising:
  a detection unit, coupled to the gate of the first P-type transistor, for detecting a detected voltage related to the differential input signal pair to output a control signal; and
  a selection unit coupled to the detection unit for outputting the body bias according to the control signal.

13. The amplifier of claim 12, wherein the detection unit is coupled to the output node of the amplifier for detecting the detected voltage related to the differential input signal pair and accordingly outputting the control signal.

14. The amplifier of claim 12, wherein a supply voltage of the amplifier is within a positive voltage and a negative voltage.

15. The amplifier of claim 12, wherein the detection unit comprises:
 a comparator for comparing the detected voltage and a first reference voltage to output a comparison result; and
 an inverter for receiving the comparison result to output the control signal.

16. The amplifier of claim 15, wherein the first reference voltage is larger than a sum of a negative P-N junction forward conduction voltage and a threshold voltage of the first P-type transistor.

17. The amplifier of claim 15, wherein the detection unit outputs the control signal indicating a conducting status when the detected voltage is smaller than the first reference voltage.

18. The amplifier of claim 15, wherein the detection unit outputs the control signal indicating a cut-off status when the detected voltage is larger than the first reference voltage.

19. The amplifier of claim 12, wherein the selection unit comprises:
 a first transistor comprising a gate coupled to receive the control signal, a source coupled to the source of the first P-type transistor, and a drain coupled to output the body bias;
 a second transistor comprising a gate coupled to receive the control signal, a source coupled to receive a second reference voltage, and a drain coupled to output the body bias.

20. The amplifier of claim 19, wherein the second reference voltage is larger than a negative P-N junction forward conduction voltage.

21. The amplifier of claim 19, wherein the first transistor is conducted when the control signal indicates a cut-off status such that the body bias equals a voltage of the source of the first P-type transistor.

22. The amplifier of claim 19, wherein the second transistor is conducted when the control signal indicates a conducting status such that the body bias equals the second reference voltage.

* * * * *